(12) United States Patent
Stevenson et al.

(10) Patent No.: US 7,869,216 B2
(45) Date of Patent: Jan. 11, 2011

(54) COMPOSITE AVIONICS CHASSIS

(75) Inventors: James F. Stevenson, Morristown, NJ (US); David C. Vacanti, Renton, WA (US); Steve Erik Sund, Ogdensburg, NJ (US); Siu-ching D. Lui, Bridgewater, NJ (US)

(73) Assignee: Honeywell International Inc., Morristown, NJ (US)

( * ) Notice: Subject to any disclaimer, the term of this patent is extended or adjusted under 35 U.S.C. 154(b) by 72 days.

(21) Appl. No.: 12/198,008

(22) Filed: Aug. 25, 2008

(65) Prior Publication Data

US 2010/0046170 A1    Feb. 25, 2010

(51) Int. Cl.
*H05K 7/20* (2006.01)
(52) U.S. Cl. .................. 361/708; 428/408; 361/818; 361/715
(58) Field of Classification Search .................. None
See application file for complete search history.

(56) References Cited

U.S. PATENT DOCUMENTS

| | | | |
|---|---|---|---|
| 3,264,073 A | 8/1966 | Schmitt | |
| 3,951,904 A | 4/1976 | Tomonaga | |
| 4,004,194 A * | 1/1977 | Doerflinger et al. | 361/714 |
| 4,180,211 A | 12/1979 | Olcott et al. | |
| 4,312,912 A | 1/1982 | Tamura | |
| 4,401,495 A | 8/1983 | McKinney | |
| 4,530,949 A | 7/1985 | Atkinson et al. | |
| 4,556,439 A | 12/1985 | Bannink, Jr. | |
| 4,624,798 A | 11/1986 | Gindrup et al. | |
| 4,861,643 A | 8/1989 | Scollard | |
| 4,876,050 A | 10/1989 | Horton | |
| H1002 H | 12/1991 | Hahn | |
| 5,100,726 A | 3/1992 | Nakagawa | |
| 5,136,119 A * | 8/1992 | Leyland | 174/379 |
| 5,334,414 A | 8/1994 | Edie et al. | |
| 5,399,295 A | 3/1995 | Gamble et al. | |
| 5,520,976 A * | 5/1996 | Giannetti et al. | 428/36.3 |
| 5,700,342 A | 12/1997 | Giannetti | |
| 5,717,160 A * | 2/1998 | Bootle | 174/384 |
| 5,786,785 A | 7/1998 | Gindrup et al. | |
| 5,827,585 A * | 10/1998 | Giannetti | 428/362 |
| 5,892,476 A | 4/1999 | Gindrup et al. | |
| 5,914,163 A | 6/1999 | Browne | |
| 6,259,394 B1 | 7/2001 | Murase et al. | |
| 6,365,257 B1 | 4/2002 | Hecht | |
| 6,403,504 B1 | 6/2002 | McMahon et al. | |
| 6,410,847 B1 | 6/2002 | Allen et al. | |
| 6,530,865 B2 | 3/2003 | Held | |
| 6,638,466 B1 | 10/2003 | Abbott | |
| 6,786,771 B2 | 9/2004 | Gailus | |
| 6,838,120 B2 | 1/2005 | Kim et al. | |
| 6,998,434 B2 * | 2/2006 | Wadahara et al. | 524/495 |
| 7,028,553 B2 | 4/2006 | Smith et al. | |
| 7,170,747 B2 * | 1/2007 | Muirhead et al. | 361/715 |
| 2002/0144032 A1 * | 10/2002 | Kriege et al. | 710/62 |
| 2005/0074593 A1 | 4/2005 | Day et al. | |

(Continued)

*Primary Examiner*—Gregory D Thompson
(74) *Attorney, Agent, or Firm*—Black Lowe & Graham, PLLC (57) ABSTRACT

An avionics chassis for protecting against damage, dust, dirt and incidental moisture over an extended temperature range, EMI shielding to prevent radiation of internal circuit energy and preventing the entrance of external EMI. The chassis provides lower weight, lower levels of radiated emissions and improved resistance to incident external radiation. Electric and magnetic shielding is also provided.

10 Claims, 6 Drawing Sheets

U.S. PATENT DOCUMENTS

| | | |
|---|---|---|
| 2005/0263456 A1 | 12/2005 | Cooper et al. |
| 2006/0180264 A1 | 8/2006 | Kisch et al. |
| 2007/0006880 A1 | 1/2007 | Smith et al. |
| 2008/0158851 A1* | 7/2008 | Cochrane .................... 361/818 |
| 2009/0095523 A1 | 4/2009 | Stevenson et al. |
| 2010/0000770 A1* | 1/2010 | Gupta et al. ................ 174/256 |

* cited by examiner

COMPOSITE AVIONICS CHASSIS

BACKGROUND OF THE INVENTION

Traditionally electronic chassis are made from multiple forms of aluminum that surround circuit boards that contain RF, microwave, millimeter wave, or high speed digital circuitry. The chassis is designed to prevent internally generated radiation from escaping outside of the chassis and external radiation from entering the chassis. Aluminum does not damp electromagnetic resonances within a cavity (a lossy material must be added) and does not provide magnetic shielding. Aluminum has a high thermal conductivity and provides means for the removal of excess heat. Machining a chassis from aluminum is an expensive manufacturing process.

The demands by aerospace customers for weight and cost reductions and simpler operation (eliminate convective cooling) open up the opportunity for novel composite materials, structures, and manufacturing processes to replace traditional materials, particularly aluminum shaped by machining. Composites can achieve a 20-50% (typical 30%) weight reduction compared to aluminum but must also match certain very desirable properties of aluminum: high electrical conductivity, high thermal conductivity and low raw material costs. However, hand layup of composites is expensive, even compared to machined aluminum, so inexpensive manufacturing methods are needed.

SUMMARY OF THE INVENTION

An electronic chassis protects internal components against damage, dust, dirt and incidental moisture over a temperature range, electromagnetic resonances resulting from internal circuit energy and the entrance of external electromagnetic interference (EMI). Both electric and magnetic shielding is also provided. The chassis contains structures that facilitate heat removal. The composition of the chassis material to include a particular class of light weight additives further reduces the weight of the chassis.

BRIEF DESCRIPTION OF THE DRAWINGS

Preferred and alternative embodiments of the present invention are described in detail below with reference to the following drawings:

FIGS. 3-1 and 3-2 illustrate an exploded perspective view of the chassis described in one embodiment of the present invention;

FIGS. 4-1 and 4-2 illustrate one embodiment of highly electrically and thermally conductive graphene plates;

DETAILED DESCRIPTION OF THE PREFERRED EMBODIMENT

A composite electronics chassis with structure and material composition is disclosed herein. In one embodiment the composite avionics chassis is sufficiently electrically and thermally conductive to provide EMI shielding but sufficiently lossy to damp electromagnetic resonances, and also light weight resulting from a polymer matrix composite which may contain hollow carbon microspheres. An electronic chassis in one embodiment includes reinforcing layers capable of retaining high strength even with the use of hollow carbon microspheres which are known to degrade properties. The chassis includes a polymeric resin combined with composite fill material(s) that in one embodiment meet Federal Aviation Administration (FAA) Flammability, Smoke Density and Toxicity (FST) requirements for commercial aircraft applications.

Figure 1:
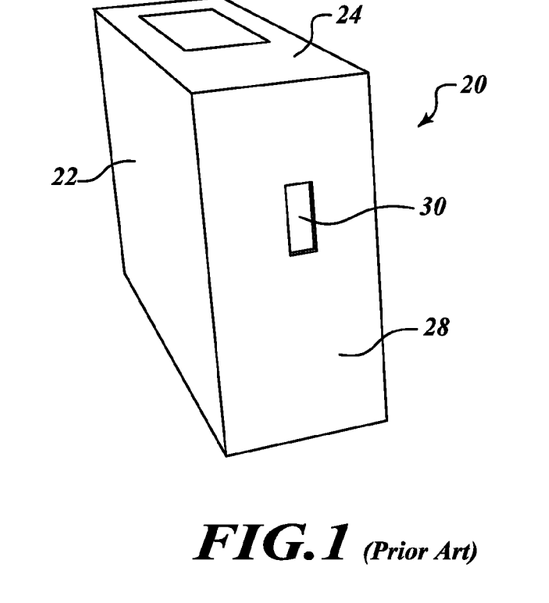
FIG. 1 illustrates a perspective view of a conventional avionic electronic chassis for housing circuit board assemblies formed in accordance with an embodiment of the present invention.
Figure 2:
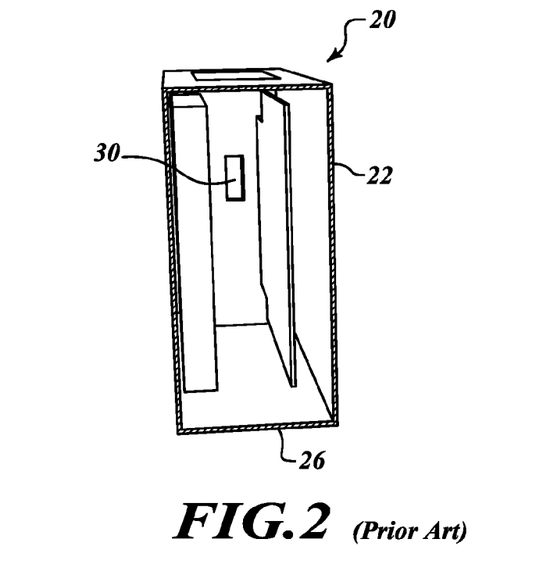
FIG. 2 illustrates a cutaway view of the chassis shown in FIG. 1.

FIGS. 1 and 2 illustrate a conventional chassis 20 made of machined aluminum with planes on the sides 22, front 24, back 26, and bottom 28. Openings 30 in the bottom 28 and top (not shown) are for air circulation to cool the cards in a conventional chassis.

Figure 31:
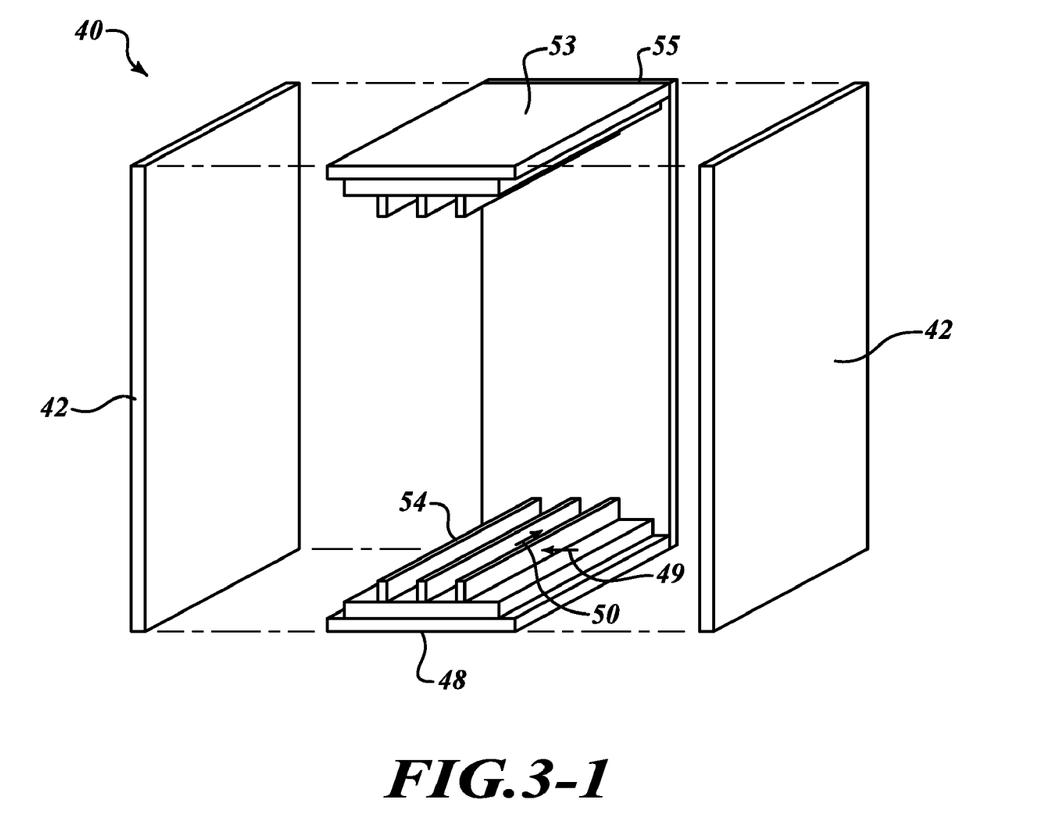
Figure 32:
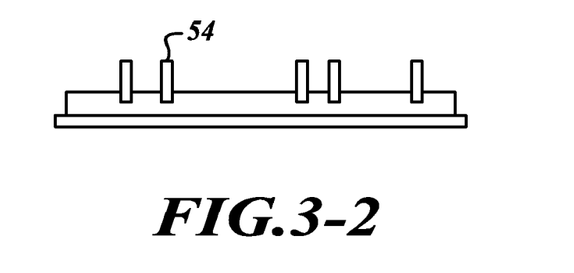

In the composite chassis 40 in FIGS. 3-1 and 3-2, the larger side panels 42 are formed by compression molding of conventional prepreg layup or of a hollow microsphere core structure clad with prepreg sheets in one embodiment. The chassis 40 includes the side panels 42, a top panel 53, a bottom panel 48, a back panel 55 and a front panel (not shown) that are made by injection, transfer or compression molding, which are very cost effective processes for high volume manufacturing.

A base plate that is attached to the bottom panel 48 includes highly electrically conductive (1050 W/m-K) Al-clad graphite plates 54 (70 in FIG. 4-2) molded as inserts. As shown in FIGS. 3-1, the Al-clad graphite plates 54 rapidly transport heat along a path 49 from circuit boards (not shown) (see FIGS. 5 and 7) and along a highly thermally conductive path 50 to an external heat sink at an end (heat sink 64 in FIG. 4-2) without the need for convective cooling. The plates 54 can also serve as ground planes.

Figure 41:
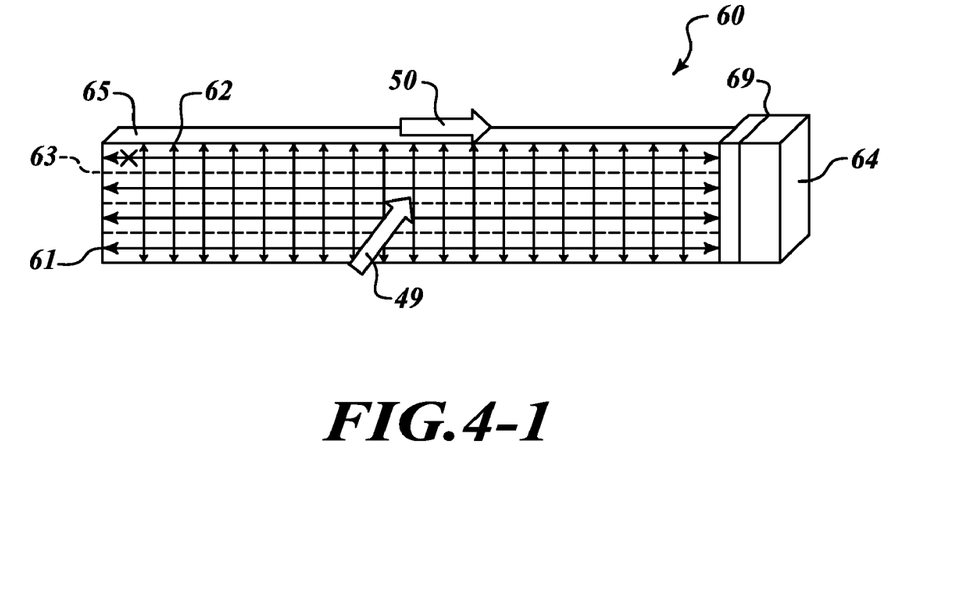
Figure 42:
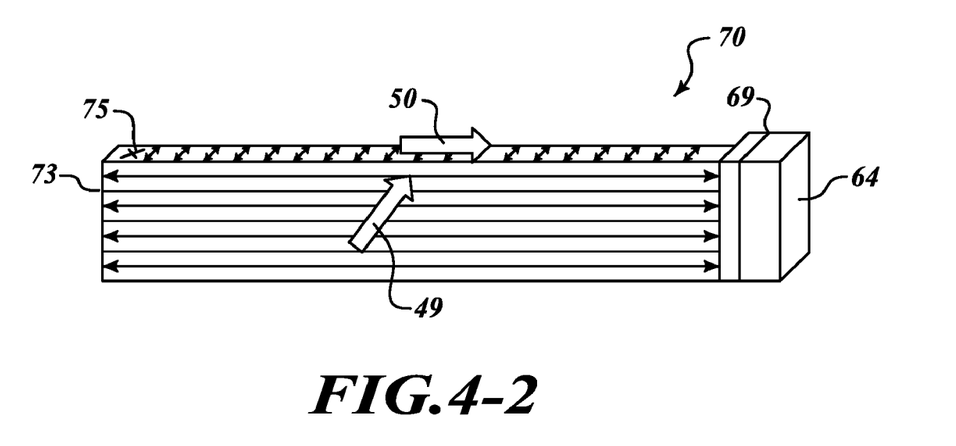

The heat conduction in graphene plates is highly anisotropic because of the two dimensional properties of graphene layers. Thermal conduction is very high in the planar directions indicated by arrows 61 and 62 in the as-manufactured plates shown in FIG. 4-1 and orders of magnitude lower in the orthogonal path 49 through the plate 60. To remove heat along a path 49 from the circuit boards and the path 50 to an external heat sink, efficient heat transfer is needed both through a first path 49 in the plate, where thermal conductivity is low in the as-manufactured plate 60, and then along a second direction 50 in the same plate 60, where thermal conductivity is high. One way to improve thermal conductivity into the plate would be to cut the graphene plate 60 into thin strips along its length as indicated by the dashed lines 63 in FIG. 4-1. The strips could then be reoriented and stacked as shown in FIG. 4-2. The reorientation involves rotating the surface marked X on strip 65 in the as-manufactured plate 60 to the surface marked X in strip 75 in the reassembled plate 70. The reoriented strips may be bonded along planes 73. In this embodiment, the high thermal conductivity directions both conduct heat away from the boards as indicated by the arrow in FIG. 4-2 and along the length as indicated by the arrow of the plate 70 to the heat sink 64.

Another way to transport heat in the low conductivity direction of the graphene plate is to drill small holes, known as vias (not shown), in the low conductivity direction and fill the holes with high conductivity material, such as aluminum.

The heat sink 64 is generally located outside the back wall 26 of the chassis. A portion 69 of the heat sink 64 may be an integral part of the chassis wall. Alternatively the heat sink 64 may be inserted through an opening in the chassis wall. The heat sink 64 disposes of heat removed from the graphene plate 70 by, for example, radiating from fins into an open environment, such as outer space, convective cooling by forced or free convention of air over finned surfaces, or transport by a pumped cooled liquid.

The use of polymers (density ~1.3 g/cc), carbon fiber (~1.8 g/cc), and crush resistant hollow microspheres (~0.55 g/cc) compared to aluminum (2.7 g/cc) lower the overall weight of the assembled part. The large flat side panels 42 on the chassis 40 can be made by pressing laid up prepreg, or by applying cladding (carbon fabric prepreg) to a microsphere-resin composition (similar to sheet molding compound production).

The chassis 40 is molded from composite materials which include a base resin. Various materials can be combined within the chassis 40 to achieve different levels of conductivity, strength and weight.

In one embodiment, a microscale carbon material is hollow carbon microspheres which, below 50 microns in diameter, have sufficient crush strength for injection molding. The microspheres have the advantage of very light weight because of the low density of carbon and the fact they are hollow. Data on hollow microspheres generally show improved crush resistance as the microspheres decrease in diameter and increase in density; these trends in size and density are observed to occur naturally in the sphere manufacturing process.

The base resin may be polyetherimide (PEI) that is combined with one or more of the filler materials above. PEI is amorphous, amber transparent, high-performance thermoplastic that provides high heat resistance, high strength and modulus, and excellent electrical insulating properties. PEI, which maintains properties with continuous exposure to 340° F. (170° C.), is ideal for high strength/high heat applications, is hydrolysis resistant, is highly resistant to acidic solutions and is capable of withstanding repeated autoclaving cycles. PEI grades are available in an electrostatic dissipative grade, and FDA, and USDA compliant grades. Common trade names for PEI include Ultem®, Tecapei®, and Tempolux®.

Polyethersulfone (PES) (e.g., Ultrason® (BASF)) may be used instead of PEI. PES is also high temperature resistant (180° C. continuous use temperature) with good mechanical performance at high temperatures.

Polyphenylene sulfide (PPS) (e.g. Ryton®) is a highly crystalline (50-60% crystallinity) thermoplastic. PPS is fire resistant, impervious to aircraft fluids, and has a lower melt viscosity because it is a semicrystalline material. Its mechanical properties and temperature tolerance do not match PEI, but high temperature capability is not needed for electronics housings.

The chassis formed from the matrix materials described above may also include various forms of carbon materials to provide the required levels of electrical conductivity and greatly improved mechanical properties over the neat matrix resin. Nickel coated carbon or nickel particulates may be added in any combination to achieve higher conductivity and provide magnetic shielding. Desired conductivity with lowest weight and cost may also be achieved by using yet higher levels of carbon fiber to minimize the use of nickel, which is heavy and expensive.

In one embodiment, pellets for injection molding a chassis are made by mixing 20 wt % chopped carbon fiber (Fortafil® 219), 10 wt % nickel coated carbon fiber (Sulzer NiCF) and 70 wt % polyetherimide (Ultem® 1000). The pellets have an electrical resistivity of 3.7 ohm-cm and a density of 1.37 g/cc. Tensile properties (ASTM D-638-03) at room temperature were 28,000 psi tensile strength, 1,200,000 psi modulus, and 1.2% elongation. The corresponding flexural properties (ASTM D-790-07) are 35,000 psi flexural strength, and 3,000,000 psi flexural modulus. Other percentage mixtures may be used to obtain different properties.

In another embodiment the properties for the composite composition are electrical conductivity in the target range of 0.1 (1/ohm-cm) −1 to 2.0 (1/ohm-cm), density target of less than 1.1 g/cc, and flexural modulus target value greater than 600,000 psi for a composition based on an hand mixed epoxy resin. The matrix materials for these compositions advantageously pass the FST test. Compositions to be processed by injection molding, a rapid high pressure process, preferably have a low melt viscosity which allows filling of thin wall molds to allow both material cost and weight savings. Because of the harsh molding and compounding conditions these compositions require crush resistant microspheres with smaller diameters and relatively higher densities. Compression molding is a less demanding process which permits higher viscosity and requires lower molding pressures, allowing microspheres with thinner walls and lower density.

An example composition that meets these requirements for compression molding comprises 9.5 vol % milled carbon fibers and 19 vol % hollow carbon microspheres in a matrix of Epon™ 862 epoxy with Epikure™ W hardener. The microspheres used in this composition, which were not crush resistant, have a relatively larger diameter and a density of 0.38 to 0.43 g/cc as measured by a pycnometer. The microspheres lowered the density of this composition to 0.95 g/cc from 1.14 g/cc for a control with 19 vol % milled carbon fibers and no microspheres. The electrical resistivity for the composition was 0.59 ohm-cm which is within the target range of 0.5 to 10 ohm-cm.

Yet another embodiment suitable for injection molding comprised small diameter (40 micron), higher density 0.55 g/cc microspheres (EP36) at 8 wt % level compounded with 20 wt % chopped carbon fiber (Fortafil® 219) in a polyphenylene sulfide (Ryton® P6) resin.

In yet one more embodiment, compression molded panels were prepared by placing two layers of 5-harness carbon fiber prepreg as the top and bottom layers surrounding a core of bismaleimide matrix (Cycom® 5052-4) containing 17 wt % hollow carbon microspheres. These microspheres with a lower density of 0.38 to 0.43 as measured by a pycnometer would not be able to withstand the high pressures encountered in injection molding. The microsphere-matrix composition without other reinforcement is expected to have a modulus lower by a factor of 5 or more compared to a composite with continuous fiber reinforcement. The prepreg clad microsphere composite described in this example has a flexural modulus at 240° C. of 2,700,000 psi which is only about a 25% reduction compared to a BMI continuous fiber prepreg (Cycom® 5250HT) composite. The cladding substantially reduces the loss in properties associated with the use of hollow microspheres.

Figure 5:
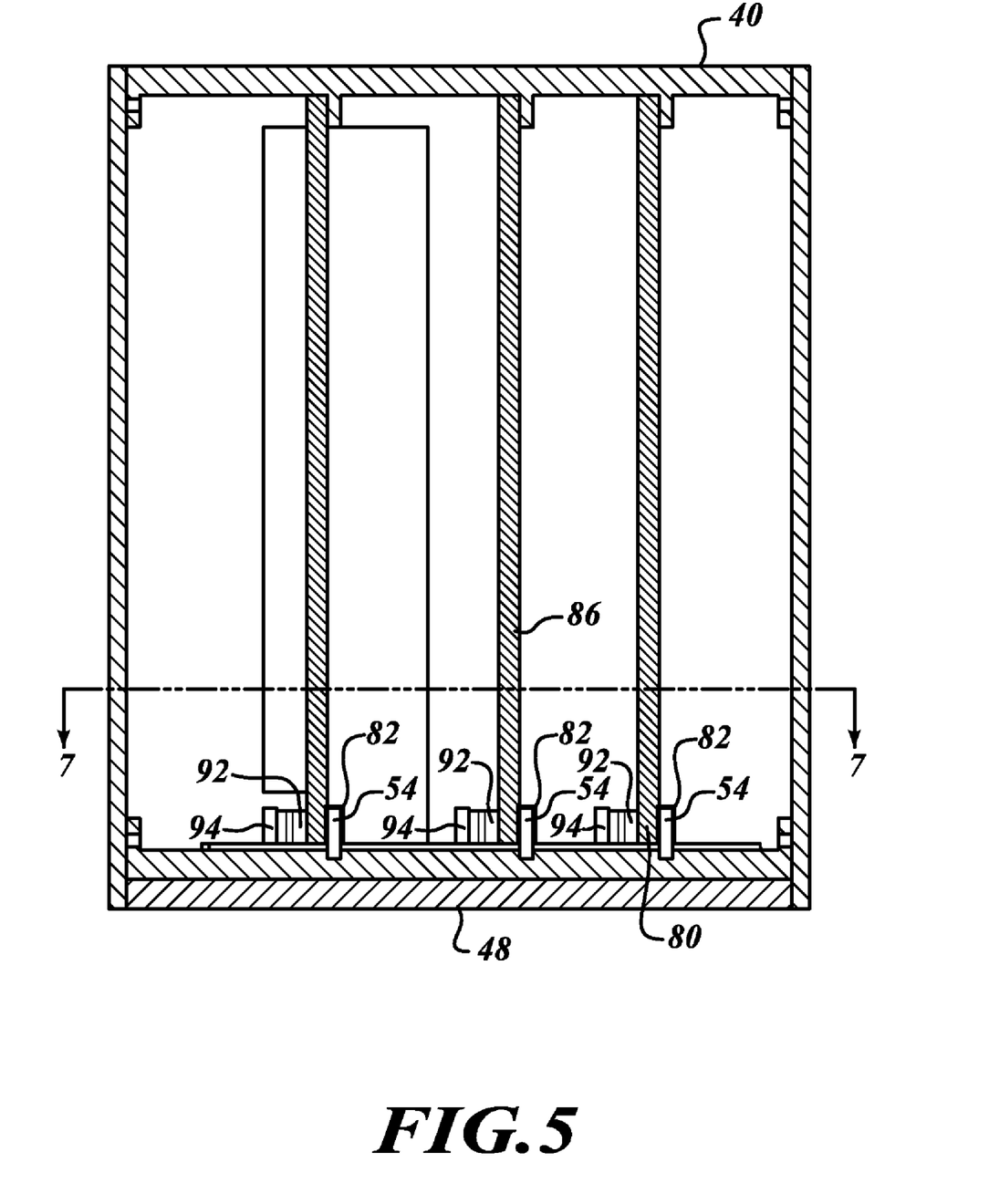
FIG. 5 is an end cross-sectional view of a chassis formed in accordance with an embodiment of the present invention
Figure 6:
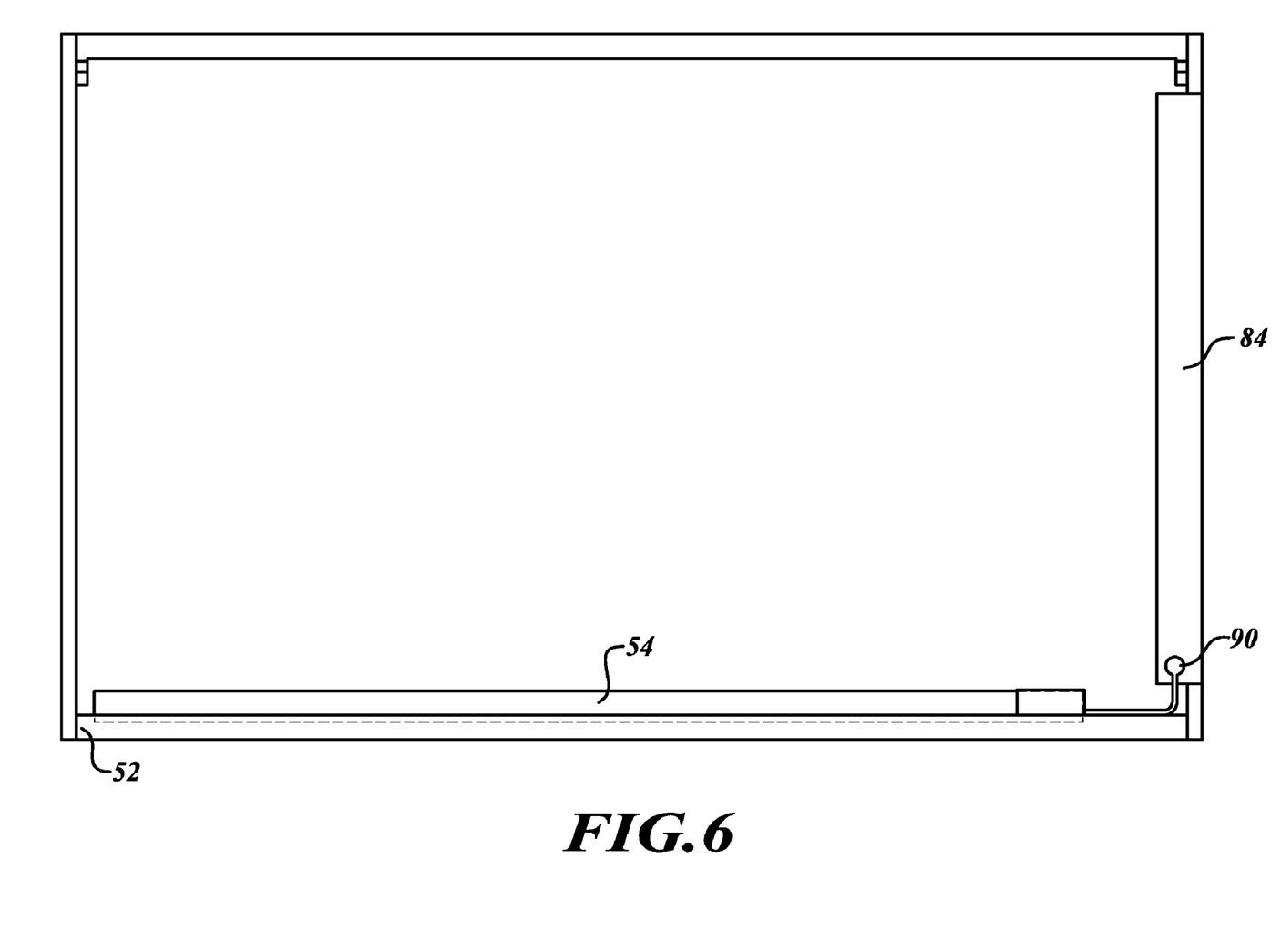
FIG. 6 is side cross-sectional view of a portion of the chassis of FIG. 5.
Figure 7:
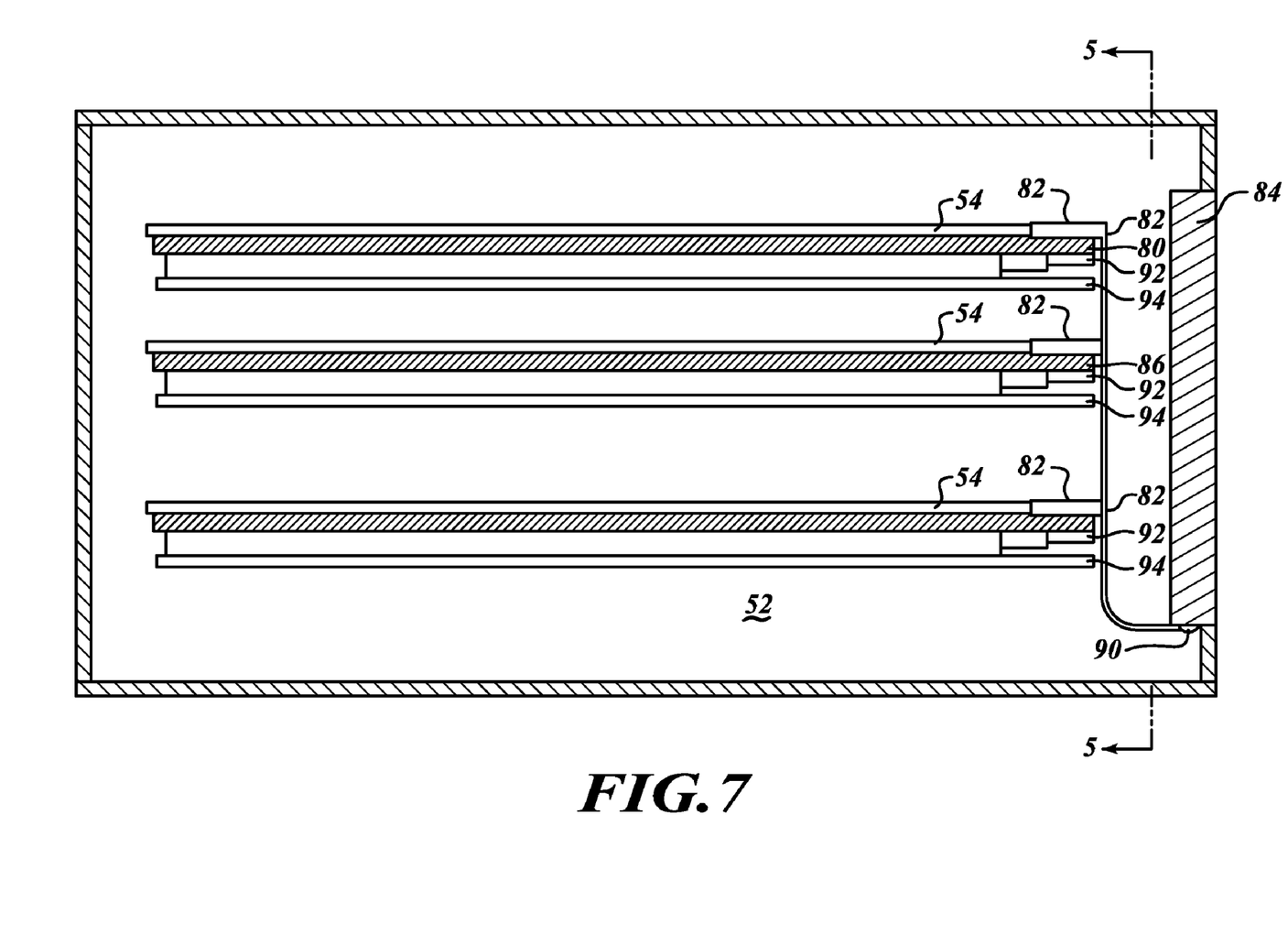
FIG. 7 is a vertical cross-sectional view of the chassis of FIG. 5.

FIGS. 5-7 show a device 82 for electrically connecting the Al-Clad card guides (plates 54) to one another and then to a common ground connection on any rear connector 84 located at the back panel 55 of the chassis 40. By themselves the Al-Clad guides (plates 54) are electrically and thermally conductive but electrically they do not go anywhere and make a poor ground connection. The rear connector 84 is in contact with an aircraft heat sink (not shown) for moving the heat away from the chassis 40.

In one embodiment, the device 82 is a chemical etched metal piece that covers the plates 54 to provide the electrical ground. The device 82 may include straps to connect to a common ground stud 90 in FIG. 6 located on the rear connector 84. The device 82 may be formed into various configurations in order to connect each printed wiring assembly 80 to have a connection to an electrical ground and/or heat sink.

In another embodiment, an internal composite wall 86 in the chassis absorbs electromagnetic energy and also shields internal components in one region of the chassis from electrometric energy from components in another region. The shield wall materials may be of the compositions described heretofore and may be lighter and thinner than the chassis external walls because load and durability requirements may be less for internal walls.

The internal composite wall 86 and any circuit boards are held in place within the chassis 40 using known techniques, such as with a wedge device 92 and a second guide or wall 94. The second guide or wall 94 may be the same as the plates 54 and attached to base plate 52 and bottom panel 48 in a similar manner.

The polymer resin is an at least one of polyetheretherketone, polyetherketoneketone, polyetherimide, polyphenylene sulfide, polyamideimide, and polysulfones. In another embodiment, the polymer resin is at least one of epoxy resin, bismaleimide resin, phenolic resin, polyimide resin, and cyanate ester resin.

The microspheres have been subject to a heat treatment in excess of 1400° C.

The composite panel includes more than one panels. An adhesive bonding agent bonds the panels together.

The reconfigured plates have thermal conductivity in excess of 800 W/m-K in at least in two directions.

While the preferred embodiment of the invention has been illustrated and described, as noted above, many changes can be made without departing from the spirit and scope of the invention. Accordingly, the scope of the invention is not limited by the disclosure of the preferred embodiment. Instead, the invention should be determined entirely by reference to the claims that follow.

The embodiments of the invention in which an exclusive property or privilege is claimed are defined as follows:

1. An electronic chassis comprising:
   at least one composite panel formed by one of the processes of injection, transfer, and compression molding, the at least one composite panel comprises:
      a core material comprising one or more types of carbon based materials, the one or more types of carbon based materials comprises hollow microspheres with an average sphere diameter less than 50 microns and carbon fiber; and
      a polymer resin,
   wherein the at least one composite panel comprises ordered graphene plates having high two-dimensional thermal conductivity, wherein the graphene plates are structured to maximize heat transfer from internal sources to a heat sink.

2. The chassis of claim 1, wherein the at least one composite panel further comprises at least one cladding layer configured to form at least one of the external surfaces of the core material.

3. The chassis of claim 1, wherein the at least one composite panel comprises an electrical resistivity between 0.1 and 2 ohm-cm.

4. The chassis of claim 1, wherein the at least one composite panel comprises at least two panels, the chassis further comprising an adhesive bonding agent configured to bond the at least two panels together.

5. The chassis of claim 1, wherein the structure of the graphene plates is reconfigured by cutting the graphene plates into thin sections and stacking the sections so that cut edges are exposed adjacent to circuit board surfaces.

6. The chassis of claim 5, wherein the reconfigured plates have thermal conductivity in excess of 800 W/m-K in at least in two directions.

7. The chassis of claim 1, further comprising an internal panel composed of one or more carbon based materials is positioned in the chassis between at least two circuit boards having electronic components.

8. The chassis of claim 1, wherein the graphene plates are clad with an electrically and thermally conductive material having mechanical properties sufficient to protect the graphene plates.

9. An electronic chassis comprising:
   at least one composite panel formed by one of the processes of injection, transfer, and compression molding, the at least one composite panel comprises:
      a core material comprising one or more types of carbon based materials, the one or more types of carbon based materials comprises hollow microspheres with an average sphere diameter less than 50 microns and carbon fibers; and
      a polymer resin.

10. The electronic chassis of claim 9, where the percentages by weight for the hollow microspheres and carbon fibers are as follows: 8% and 20%.

* * * * *